United States Patent [19]

Caule

[11] 3,944,449

[45] Mar. 16, 1976

[54] METHOD OF PRODUCING TARNISH RESISTANT COPPER AND COPPER ALLOYS AND PRODUCTS THEREOF

[75] Inventor: Elmer J. Caule, New Haven, Conn.

[73] Assignee: Olin Corporation, New Haven, Conn.

[22] Filed: Mar. 15, 1973

[21] Appl. No.: 341,513

Related U.S. Application Data

[60] Division of Ser. No. 177,291, Sept. 2, 1971, Pat. No. 3,764,399, which is a continuation-in-part of Ser. No. 59,684, July 30, 1970, Pat. No. 3,677,828, and Ser. No. 67,943, Aug. 28, 1970, Pat. No. 3,716,427, which is a continuation-in-part of said Ser. No. 59,684.

[52] U.S. Cl............ 156/316; 148/6.15 R; 148/6.16; 156/319; 428/458; 428/469
[51] Int. Cl.$^2$............................................ C23F 7/12
[58] Field of Search ............ 156/3, 8, 18, 314, 316, 156/319; 174/68.5; 161/191, 213; 96/36.2; 117/213; 148/6.15 R, 6.31; 428/457, 458, 469

[56] References Cited
UNITED STATES PATENTS

| | | | |
|---|---|---|---|
| 3,455,751 | 7/1969 | Frantzen | 156/3 |
| 3,466,207 | 9/1969 | Vincent | 252/79.4 |
| 3,620,933 | 11/1971 | Grunwald et al. | 156/3 |
| 3,677,828 | 7/1972 | Caule | 148/6.15 R |
| 3,716,427 | 2/1973 | Caule | 148/6.15 R |
| 3,833,433 | 9/1974 | Caule | 148/6.16 |

FOREIGN PATENTS OR APPLICATIONS

| | | | |
|---|---|---|---|
| 1,965 | 11/1963 | Japan | 148/6.16 |

OTHER PUBLICATIONS

Photopolymer Resist System–Dupont Brochure, A–60571, 5/14/68.

*Primary Examiner*—William A. Powell
*Assistant Examiner*—Michael W. Ball
*Attorney, Agent, or Firm*—David A. Jackson; Robert H. Bachman

[57] ABSTRACT

The instant invention comprises providing copper or a copper alloy which has on its surface a uniform glassy like and substantially pore free coating of copper phosphate, rinsing the coated material for at least 2 seconds in water at a pH of from 4.9 to 6.3, at a temperature of 90°C to the boiling point and drying.

11 Claims, 1 Drawing Figure

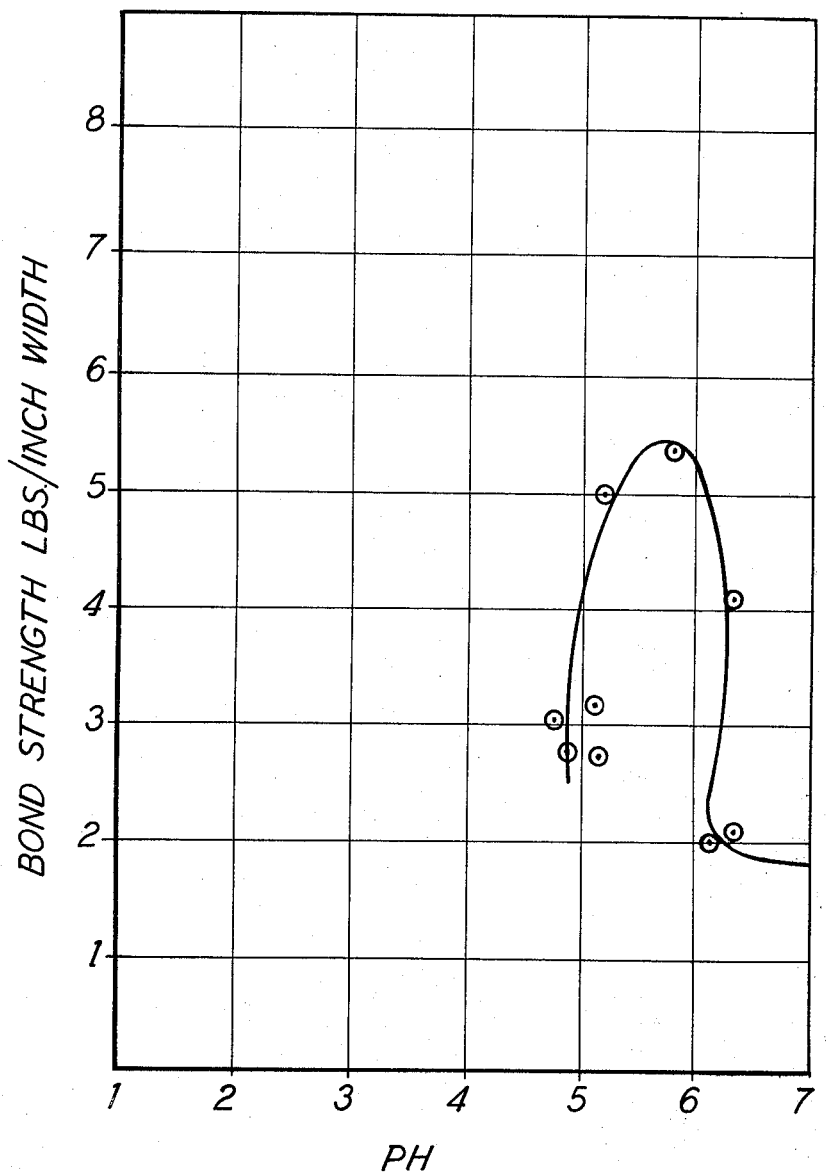

3,944,449

METHOD OF PRODUCING TARNISH RESISTANT COPPER AND COPPER ALLOYS AND PRODUCTS THEREOF

CROSS-REFERENCE TO RELATED APPLICATIONS

This application is a division of application Ser. No. 177,291 filed Sept. 2, 1971 now U.S. Pat. No. 3,764,399 which is a continuation-in-part of co-pending applications Ser. No. 59,684, filed July 30, 1970 now U.S. Pat. No. 3,667,828 and Ser. No. 67,943, filed Aug. 28, 1970, now U.S. Pat. No. 3,716,427 which is in turn a continuation-in-part of Ser. No. 59,684.

BACKGROUND OF THE INVENTION

The present invention relates specifically to metal plastic laminates having high bond strength and improved resistance to acid undercutting during manufacture of laminates into flexible printed circuits.

The present invention further broadly relates to a treating copper and copper alloys to form a tarnish and oxidation resistant film thereon.

In the manufacture of flexible printed circuits, copper foil or sheet is employed which normally has applied to its surface a film of an organic inhibitor, such as benzotriazole, in order to prolong the shelf life before manufacture of the circuit.

Flexible printed circuits comprise copper sheets or copper foil bonded to the surface of a plastic sheet, such as a polyester or polyimide. Normally two types of copper foil, either wrought or electro deposited, are employed in the manufacture of flexible printed circuits. Further it is advantageous to utilized wrought and annealed copper foil.

Printed circuits find wide use in the electrical and electronic fields since they are advantageous in the elimination of individual lead wires which require a separate soldering or other joining operation to the various components of any particular circuit. The configuration of such a circuit facilitates the positioning of conventional circuit components such as capacitors, etc., and the soldering of these components to the wiring by a dipping operation.

The manufacture of flexible printed circuits comprises adhesively bonding or laminating copper sheet or foil to a plastic film, such as a polyester polyimide, and generally employing a suitable glue. As one preferred way the copper side of the resultant laminate is then sprayed with a photoresist and the required circuit is projected onto the resist-coated side of the copper component which transforms the photoresist into an acid insoluble compound in a figure and likeness of the circuit. The laminate is then immersed or sprayed with an acid etchant, such as a ferric chloride solution, to dissolve away the unwanted portion of the copper, i.e., that portion of the copper component of the laminate which is not part of the required circuitry.

Various problems arise however in the present manufacture of flexible printed circuits to which the present invention is directed.

For example, in order to provide tarnish resistance of rolled copper and an acceptable laminated product, before laminating a film or an organic inhibitor is normally applied to the surface of the copper.

The organic inhibitor, e.g., benzotriazole, provides for long shelf life or stability during storage.

Before laminating of a wrought hard copper to the plastic film it is advantageous to anneal the copper in order to provide increased ductility which is highly desirable in flexible printed circuits. It has been found that the organic inhibitor upon the copper surface decomposes during the annealing. Due to this decomposition problems arise such as the effect of the benzotriazole is no longer apparent and therefore the product no longer has good shelf life and tarnishing occurs. The tarnishing causes both poor laminate bond strength, uneven acid etching, and rapid acid undercutting along the bonded interface during etching away of the unwanted copper portion of the laminate. The acid undercutting generally occurs at a rate equivalent to at least 30 mils per hour from each side of the copper circuitry, at the aforementioned interface, and materially degrades the quality of the printed circuit.

Therefore, unless treated the copper foil-plastic laminate exhibits poor bond strength when room temperature oxidation or tarnishing occurs on the foil. Furthermore, the resistance to acid undercutting along the interface of the wrought annealed foil is poor as aforementioned. A further complication with wrought annealed and other foil arises with the use of organic inhibitors such as benzotriazole, since residual benzotriazole on the unbonded side of the foil results in uneven etching of the circuit because the benzotriazole provides some inhibition in the etching solution. A still further disadvantage with organic inhibitors occurs with certain plastic systems wherein high temperatures, i.e., above 240° F. are employed for curing of the glue. These high temperatures cause the copper-organic inhibiting film to decompose with the formation of relatively large amounts of gases which causes blistering of the laminate and thereby producing an unacceptable product.

It is well known, as aforementioned, that copper and many of its alloys possess low resistance to tarnishing in many atmospheres and particularly atmosphere containing industrial wastes such as compounds of sulfur. It is therefore required, in order to provide a measure of tarnish resistance for a relatively prolonged period of time, that a film of an organic inhibitor, such as benzotriazole, be applied to the surface of the copper or copper alloy.

The application of such inhibitors provides for prolonging the aesthetic appeal of copper materials in finished form, such as lamp bases and other consumer goods for the home, and also provides for long shelf life before further manufacture of such materials into final consumer articles. This is particularly important since prolonged exposure of copper materials in an industrial environment naturally degrades the exposed surfaces resulting in build up of corrosion products, such as copper oxides and sulfides, which may necessitate a severe mechanical or chemical cleaning operation in order to restore the material surfaces to a condition compatible for normal further cleaning and manufacturing operations, e.g., a simple alkaline clean or degreasing cycle before additional mechanical working or soldering of the material.

It is therefore a principal object of the present invention to provide a method for producing increased tarnish resistance of copper and its alloys, and the article produced thereby.

It is an additional object of the present invention to provide a method for producing a copper, or copper alloy sheet or foil adhesively laminated to a plastic film to form a laminate wherein the laminate is characterized by increased resistance to acid undercutting and uneven dissolution of the unwanted copper during manufacture of the laminate into a flexible circuit, and the article produced thereby.

It is a further object to provide a method for producing a flexible printed circuit which is characterized by no substantial undercutting of the circuitry and by high bond or peel strength and tarnish resistance without degradation of other properties so desirable in flexible printed circuitry, and the article produced thereby.

It is still a further object of the present invention to provide the objects as aforesaid conveniently, expeditiously and inexpensively.

Further objects and advantages of the present invention will become apparent hereinafter.

SUMMARY OF THE INVENTION

The present invention comprises providing copper or an alloy thereof having on its surface a uniform glassy like and substantially pore free coating of copper phosphate and rinsing in heated water at a temperature of at least 90° C and a pH of about 4.9 to 6.3 for at least 2 seconds and drying.

The present invention also provides for further adhesively bonding or laminating the treated copper or copper alloy to a plastic film to form a laminate and for further forming of the laminate into a flexible printed circuit. A preferred method of forming of the flexible printed circuit is by applying a photoresist to the surface of the aforementioned foil or sheet opposing the surface bonded to the plastic film, projecting the desired circuitry upon the photoresist to form an acid insoluble compound in the area of the required circuitry, dissolving away the unwanted copper in an acidic solution and then rinsing and drying.

The present invention additionally provides for highly tarnish resistant copper or alloy thereof having on its surface a glassy like and substantially pore free film or copper complex phosphate from 20 to 1000 Angstrom Units thick. When the aforementioned copper or copper alloy is adhesively laminated to a plastic film, as for example, in the form of a flexible printed circuit, the printed circuit is characterized by stable high bond strength and substantially no acid undercutting of the copper circuitry in the bonded interface.

It is a particular advantage of the present invention that the treated wrought copper foil or sheet can be annealed prior to the aforementioned adhesively bonding step, which provides the advantage of high ductility of a wrought-annealed copper foil or sheet product.

It is to be noted that the present invention also broadly relates to highly tarnish resistant copper or an alloy thereof which possess long shelf life, better solderability shelf life, and therefore materially reduces requisite cleaning of a fully manufactured and treated copper article as well as copper or copper alloy which requires further manufacturing or processing into finished articles, such as laminates and flexible printed circuits.

BRIEF DESCRIPTION OF THE DRAWINGS

The accompanying FIGURE shows the effect of pH on bond strength in the rinsing of the present invention.

DETAILED DESCRIPTION

The material provided is copper or a copper alloy having on its surface a glassy like and substantially pore free coating of copper phosphate ranging in thickness of from 20 to 1000 Angstrom units.

The aforementioned coating may be formed in accordance with Ser. Nos. 59,684 and 67,943 which teach preferred methods of producing such a coating.

For example Ser. No. 67,943 teaches applying a phosphoric acid solution containing from about 3.5 grams per liter up to the solubility limit of sodium dichromate ($Na_2Cr_2O_7 \cdot 2H_2O$) or potassium dichromate ($K_2Cr_2O_7$) or mixtures thereof to copper and its alloys. Normally, the application of the aforementioned solution is by immersion of, for example sheet or foil, in a bath.

The acid normally employed is from about 8 to 85 percent concentration of phosphoric acid of the formula $H_3PO_4$ although a solution of phosphates such as acid solutions of, for example, sodium ($Na_2HPO_4$), potassium ($K_2HPO_4$), and lithium ($LiH_2PO_4$) phosphate may also be readily employed in a concentration range normally corresponding to about 15 percent of phosphoric acid of the formula $H_3PO_4$ up to their solubility limits in water.

Ser. No. 59,684 describes a method wherein copper, or an alloy thereof, is first oxidized by heating in an environment containing oxygen or wherein air has not been excluded. The temperature is from about 200°–340° C and the time employed from about 5 to 45 minutes in order to form the requisite oxide film.

Following this oxidation step the copper, normally in sheet or foil form, is phosphated by applying a phosphoric acid solution, such as by immersion, to the oxidized surface. The acid normally employed is about 15 to 85 percent concentration of phosphoric acid of the formula $H_3PO_4$ although a solution of phosphates such as acid solutions of, for example, sodium ($Na_2HPO_4$), potassium ($K_2HPO_4$), and lithium ($LiH_2PO_4$) phosphate may also be readily employed in a concentration range normally corresponding to about 15 percent of phosphoric acid of the formula $H_3PO_4$ up to their solubility limits in water.

The temperature of the phosphoric acid solution is normally ambient for practical considerations but may range from below that of room up to the boiling point. The phosphoric solution may also be suitable agitated such as by conventional mechanical means if desired.

Rinsing is carried out in heated water having a pH of from 4.9 to 6.3 and the temperature of the water ranges from about 90° C up to the boiling point.

Addition agents found suitable to adjust the pH are the mineral acids, such as phosphoric and sulfuric acid, salts with an acid reaction, i.e., salts of a strong acid and a weak base, and mixtures thereof.

The rinse of the present invention converts the copper phosphate coating to a copper complex phosphate in which at least a portion of the copper irons have been exchanged by protons.

The coating obtained after the rinse is of the same thickness as before the rinse and more particularly 20 to 1,000 Angstrom units thick, as aforementioned.

The copper or copper alloy is rinsed for at least 2 seconds and, although not critical, rinsing is not normally longer than about 2 minutes for practical considerations. Normally rinsing is by immersion in a rinse bath although other methods such as spraying may also be readily employed. Suitable agitation in an immersion type rinse may also be provided, if desired.

If desired, the copper or copper alloy may first be given a preliminary rinse, such as a spray rinse, in cold or unheated water with the pH unadjusted in order to first remove the excess phosphating solution before rinsing at a pH of about 4.9 to 6.3.

Following the rinsing, the copper or copper alloy is then dried such as by air blast, rinsing in an alcohol solution such as methanol and allowing to dry or merely by allowing to dry by exposure to the atmosphere.

Following rinsing and drying the treated surface of the copper sheet of foil may be adhesively laminated to a plastic film such as by employing a high temperature glue in order to form a laminate.

The resultant laminate comprising copper sheet or foil and a plastic film is particularly useful in the manufacture of flexible printed circuitry. Although not critical the preferred plastic film comprises a polyester or a polyimide organic compound, and in particular Mylar and Kapton, respectively.

Preferably, but not necessarily, before the aforementioned laminating the copper foil or sheet is recrystallized annealed, when in the hard condition, in a reducing atmosphere at a temperature from about 250° to 500° F for at least about 8 minutes, and preferably not longer than about 16 hours when at a temperature of about 250° to 350° F, and preferably not longer than about ½ hour when at a temperature in the aforementioned range in excess of about 350° F.

A further embodiment of the present invention is the applying of a photoresist to the unbonded surface of the copper component of the aforementioned laminate and then conventionally impressing a pattern of the required circuitry which transforms the photoresist to an acid insoluble compound at the area of the impressed circuitry.

The unwanted copper is then dissolved away by a suitable etchant such as acidic ferric chloride, in those areas of the laminate wherein the photoresist has not been transformed into an acid insoluble compound during projection of the circuitry. The laminate is then rinsed and dried and thereby a completed flexible circuit is formed.

The copper provided in forming the flexible printed circuit of the present invention is normally from about 0.25 to 6 mils in thickness and may be any suitable copper or alloy thereof which is capable of carrying the required current for the intended application. Normally, CDA Alloy 110 (99.90 percent minimum copper, 0.04 nominal oxygen) or CDA Alloy 102 (99.95 percent minimum copper) is employed. Naturally it is also preferred that the sheet or foil be suitably cleaned before treatment.

If the coating is provided in accordance with Ser. No. 59,684 the surface is preferably roughened before the treating to provide an average roughness of about 1 to 20 micro inches, RMS, should the material be laminated to a polyester. Any suitable method of roughening may be employed such as, for example, pack rolling, rolling with suitably roughened rolls, or abrasive blasting.

It has been surprisingly found that when the sheet or foil is rinsed after phosphating as aforementioned the bond strength and resistance to acid undercutting are either increased or stabilized and thus the present invention increases the resistance of the bond strength to decay with time. By rinsing as aforementioned long term service life is to be expected. The rinse provides increased resistance to oxidation of copper and its alloys when in an elevated temperature environment, such as soldering, thus providing the retention of a pleasing appearance of the material when subjected to such an environment.

Furthermore, the aforementioned rinse also provides increased resistance of the bond at ambient temperature and strength to decay when the laminate is heated to elevated temperatures such as would be expected under some operating conditions. For example, the laminate of the present invention may function in a system wherein elevated temperatures may be expected, such as for example, in the aerospace field.

The circuit laminate of the present invention is thus characterized by having high bond strength as a result of the aforementioned treatment, as well as substantially no acid undercutting of the circuitry at the bonded interface, i.e., at each side of the circuitry where the circuitry is adhesively laminated to the plastic film. The high bond strength and acid undercutting resistance are not degraded by long time exposure to the atmosphere.

The circuit as well as the laminate and copper or copper alloy, of the present invention is further characterized by having uniformly thereon a glassy like, and pore free copper complex phosphate coating of a thickness of from about 20 to 1000 Angstrom units and readily overcomes the aforementioned disadvantages of high acid undercutting and of low bond strength as well as other disadvantages of the prior art.

For example, in the manufacture of flexible printed circuits electrodeposited copper foil is frequently employed in place of wrought annealed copper wherein one side, or surface, of the foil is relatively rough. The rough surface is oxidized and then both sides of the electrodeposited copper foil are treated with the aforementioned benzotriazole inhibitor. The inhibitor forms a copper salt when it reacts with the copper oxide present on both sides of the foil, intentionally on the rough side and as a residual on the other or smooth side. This residual benzotriazole salt on the smooth side causes uneven etching response of the copper foil plastic laminate.

Electrodeposited copper is also disadvantageous when bonded to a polyester film since the foil is generally of low ductility whereas a relatively high ductile material, such as rolled and annealed copper, is desirable in flexible printed circuitry wherein a polyester film, such as Mylar, or a polyimide film, such as Kapton, is employed.

Furthermore, electrodeposited copper does not tend to uniformly etch away in the unwanted areas of the copper component during formation of the circuitry due to its relatively large grain size; whereas the more uniform and fine grain size of rolled and annealed copper tends to provide for more even etching which is preferred in the forming of high quality circuitry.

Electrodeposited copper inhibited by benzotriazole is also disadvantageous when bonding to a polyimide plastic film since the adhesives used with polyimide films, such as Kapton, require a curing temperature which is sufficiently high to promote degradation of the copper benzotriazole salt thereby degrading or destroying the laminate. Therefore rolled copper foil is used with the polyimides rather than electrodeposited copper.

It is also noted that the flexible circuit of the present invention may readily be soft soldered over the aforementioned film thus providing for increased economy in assembling of composite electrical circuitry.

It is further noted that as a result of the aforementioned treatments that copper and its alloys have very high tarnish resistance and therefore long shelf life prior to laminating as well as prolonged aesthetic value since the normal corrosion products produced in both clean and polluted atmospheres are reduced.

In addition the method of the present invention of forming a tarnish resistant film on copper and alloys has also been surprisingly found to prevent sticking together of the metal sheets during annealing, which thus overcomes a prevalent problem during mill processing.

EXAMPLE

The accompanying figure shows the effect of rinse water pH on stability of bond strength.

Copper alloy 110 samples were cleaned and immersed in a solution of 50 percent phosphoric acid containing about 35 grams per liter of sodium dichromate for about 1 minute at ambient temperature. The samples were then rinsed for 30 seconds at various pH's at 100° C and tested for bond strength after heating at 150° C for 24 hours. The rinse water was adjusted to the acid pH range with phosphoric acid. The samples were then adhesively laminated to a polyester "Mylar" film with a polyester glue containing a di-isocyanate cross-linking agent cured for 72 hours at ambient temperature and then heated at 150° C in air for 24 hours, cooled and the bond strength tested by fastening strips 1 centimeter wise to the rim of a free running 6 inches diameter German wheel with the copper side out. The force required to pull the copper free from the glue in the radial direction was measured with a spring balance and the force per inch of width calculated from the data obtained. The rate of peel was held at 1 inch per minute with care being taken that the bond was broken at the glue-metal interface.

It is clearly seen that maximum stability of bond strength is obtained at a pH of from 4.9 to 6.3.

This invention may be embodied in other forms or carried out in other ways without departing from the spirit or essential characteristics thereof. The present embodiment is therefore to be considered as in all respects illustrative and not restrictive the scope of the invention being indicated by the appended claims, and all changes which come within the meaning and range of equivalency are intended to be embraced therein.

What is claimed is:

1. A method of producing a flexible laminate, comprising:
    A. providing a material selected from the group consisting of copper foil and copper sheet,
    B. applying to a surface of said material a phosphoric acid solution of at least 8 percent concentration and containing from 3.5 grams per liter up to the solubility limit of a material selected from the group consisting of sodium dichromate and potassium dichromate and mixtures thereof, for at least 2 seconds, to form a uniform, glassy-like, substantially pore-free coating of copper phosphate from 20 to 1000 Angstroms thick, provided that when the concentration of phosphoric acid is increased, the minimum dichromate concentration is proportionately increased,
    C. rinsing said material for at least two seconds in water at a pH of from about 4.9 to 6.3 and at a temperature from about 90° C up to the boiling point,
    D. drying said material, and
    E. adhesively laminating a plastic film to said surface.

2. A method according to claim 1 wherein said water is adjusted to said pH by adding a compound selected from the group consisting of the mineral acids, the salts of strong acids and weak bases, and mixtures thereof.

3. A method according to claim 1 wherein following step B and prior to step C said material is rinsed in water with the pH adjusted.

4. A method according to claim 1 wherein following step D and before step E and material is recrystallized annealed.

5. A method according to claim 2 wherein said water is adjusted to said pH by adding an acid selected from the group consisting of phosphoric acid and sulfuric acid.

6. A method of producing a flexible laminate comprising:
    A. providing a material selected from the group consisting of copper foil and copper sheet,
    B. oxidizing a surface of said material to form a surface oxide film from 150 to 1000 Angstrom units in thickness,
    C. applying a phosphoric acid solution to said oxide film to form thereon a uniform, glassy-like, substantially porefree coating of copper phosphate,
    D. rinsing said material for at least two seconds in water at a pH of from about 4.9 to 6.3 and at a temperature from about 90° C up to the boiling point,
    E. drying said material, and
    F. adhesively laminating a plastic film to said surface.

7. A method according to claim 6 wherein said water is adjusted to said pH by adding a compound selected from the group consisting of the mineral acids, the salts of strong acids and weak bases, and mixtures thereof.

8. A method according to claim 6 wherein following step C and prior to step D said material is rinsed in water with the pH unadjusted.

9. A method according to claim 6 wherein said plastic film is a polyester and said surface of said material is roughened to provide an average roughness peak of about 1 to 20 micro inches, RMS, prior to step B.

10. A method according to claim 6 wherein following step E and before step F said material is recrystallized annealed.

11. A method according to claim 7 wherein said water is adjusted to said pH by adding an acid selected from the group consisting of phosphoric acid and sulfuric acid.

* * * * *

UNITED STATES PATENT OFFICE
CERTIFICATE OF CORRECTION

PATENT NO. : 3,944,449
DATED : March 16, 1976
INVENTOR(S) : Elmer J. Caule

It is certified that error appears in the above-identified patent and that said Letters Patent are hereby corrected as shown below:

Column 1, line 12, delete "3,667,828" and insert --3,677,828--;

Column 1, line 22, delete "a";

Column 1, line 48, after "polyester" insert --or--;

Column 1, line 65, delete "or" and insert --of--.

Column 3, line 54, delete "possess" and insert --possesses--.

Column 4, line 6, after "example" insert --,--;

Column 4, line 55, delete "irons" and insert --ions--.

Column 8, line 17, delete "adjusted" and insert --unadjusted--;

Column 8, line 19, delete "and", second occurrence to --said --;

Column 8, line 35, delete "porefree" and insert --pore-free--.

Signed and Sealed this

Thirteenth Day of July 1976

[SEAL]

Attest:

RUTH C. MASON
*Attesting Officer*

C. MARSHALL DANN
*Commissioner of Patents and Trademarks*